(12) United States Patent
Tsai et al.

(10) Patent No.: US 6,850,442 B2
(45) Date of Patent: Feb. 1, 2005

(54) FLASH MEMORY WITH SENSING AMPLIFIER USING LOAD TRANSISTORS DRIVEN BY COUPLED GATE VOLTAGES

(75) Inventors: Hong-Ping Tsai, Kao-Hsiung (TW); Yu-Ming Hsu, Hsin-Chu (TW)

(73) Assignee: eMemory Technology Inc., Hsin-Chu (TW)

( * ) Notice: Subject to any disclaimer, the term of this patent is extended or adjusted under 35 U.S.C. 154(b) by 38 days.

(21) Appl. No.: 10/248,112

(22) Filed: Dec. 19, 2002

(65) Prior Publication Data

US 2004/0017695 A1 Jan. 29, 2004

(30) Foreign Application Priority Data

Jul. 25, 2002 (TW) ........................................ 91116642 A

(51) Int. Cl.⁷ .............................................. G11C 16/06
(52) U.S. Cl. ............................ 365/185.21; 365/185.18; 365/185.2
(58) Field of Search ....................... 365/185.21, 185.18, 365/185.2

(56) References Cited

U.S. PATENT DOCUMENTS

| | | | | |
|---|---|---|---|---|
| 5,432,746 A | * | 7/1995 | Guedj | ........................ 365/202 |
| 5,572,465 A | | 11/1996 | Bashir | |
| 5,748,534 A | * | 5/1998 | Dunlap et al. | ......... 365/185.21 |
| 5,856,748 A | | 1/1999 | Seo | |
| 5,859,798 A | | 1/1999 | Yero | |
| 5,886,931 A | * | 3/1999 | Hashiguchi | ............ 365/189.05 |
| 6,317,362 B1 | | 11/2001 | Nomura et al. | |

* cited by examiner

*Primary Examiner*—Hoai Ho
(74) *Attorney, Agent, or Firm*—Winston Hsu

(57) ABSTRACT

A memory including a plurality of memory cells, a sensing load, a reference load, a control circuit and a comparator. Each of the memory cells can store a bit data and provide a driving current according to the bit data. The sensing load is driven by the driving current and a driving voltage to generate a sensing voltage, and the reference load is driven by the driving voltage to generate a reference voltage. The control circuit can control the driving voltage to drive the sensing load or the reference load such that the sensing voltage or the reference voltage is kept constant while the driving current changes. The comparator is for comparing the sensing voltage with the reference voltage and therefore determining the bit data stored in the memory cell that provides the driving current.

17 Claims, 10 Drawing Sheets

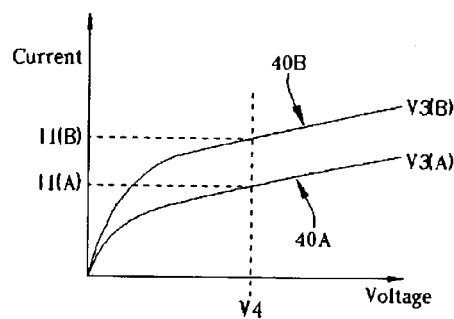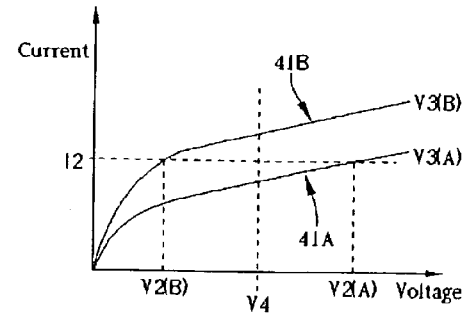
Fig. 5A                    Fig. 5B

FLASH MEMORY WITH SENSING AMPLIFIER USING LOAD TRANSISTORS DRIVEN BY COUPLED GATE VOLTAGES

BACKGROUND OF INVENTION

1. Field of the Invention

The invention relates to a flash memory, more specifically, to a flash memory with a sensing amplifier using transistors driven by coupled gate voltages for producing a load to read data.

2. Description of Background

Various microprocessor systems that are able to handle data and arrange information have become an important foundation of information development in the highly developed modern information society. The memory used to store digital data and to provide stored data for microprocessor systems is one of the most important structures in each kind of microprocessor system. A flash memory, due to electron operation, is able to store data in a non-volatile way and to read the stored data quickly and efficiently, unlike optical or magnetic storage media (such as a disc or an optical disc) that cooperates with machines so as to access data. Therefore, the flash memory with light volume and convenient and efficient operation has been utilized widely in various microprocessor systems, such as application chip systems, mobile phones, personal digital assistants, personal computers, digital cameras, etc.

Please refer to FIG. 1, which shows a circuit schematic diagram of a conventional flash memory 10. The flash memory 10 includes a memory array 14 having a plurality of memory cells (two memory cells 12A and 12B are marked in FIG. 1), each memory cell being used to store a bit data, and a transistor Q5 corresponding to each memory cell, for a reference unit. The MOS transistors Q1, Q2, Q3, Q4, inverters 16A, 16B, and a comparator 18 are organized into a sensing amplified module for reading the data stored in each memory cell. The gate of the transistor Q5 as the reference unit is biased by a fixed control voltage V0 so as to provide a fixed reference current Ip2 between its source and drain. The gate voltage of the transistor Q3 is applied by a feedback from the voltage on the node Np3 by way of the inverter 16A. Similarly, The gate voltage of the transistor Q4 is applied by a feedback from the voltage on the node Np4 by way of the inverter 16B. The transistors Q1 and Q2 whose drain and gate are shorted serve as diodes for load units, where the transistor Q1 acts as a sensing load, and both its drain and gate on the node Np1, by way of the transistor Q3, are electrically connected to the memory array 14, and the transistor Q2 on the node Np2, by way of the transistor Q4 electrically connected to the transistor Q5, acts as a reference load. The comparator 18 is capable of being formed with a differential amplifier with its differential inputs (marked as "+" and "−" in FIG. 1) respectively connected with the node Np1 and Np2 to compare the voltage on the node Np1 with the voltage on the node Np2, and the differential amplifier outputs a corresponding read signal Sr according to the compared result. The memory 10 is biased by a direct bias voltage Vd and a direct bias voltage Vg which is lower than a bias voltage Vd; the bias voltage Vg can be ground voltage (that is the zero voltage).

Each memory cell in the memory 10 has the same basic circuit configuration. Take the memory unit 12A for an example, the transistor Qm1 in the memory cell 12A is a MOS transistor with a floating gate whose gate voltage is controlled by a control voltage Vw1. The transistor Qa1 whose gate voltage is controlled by the other control voltage Vb1 acts as an access transistor. While storing data, the floating gate of the transistor Qm1 is being injected with a different amount of charge corresponding to different data. For instance, if more charge is injected into the floating gate, the transistor stores a bit data "1"; on the contrary, if less charge is injected into the floating gate, the transistor Qm1 stores a bit data "0". The amount of the charge injected into the floating gate will influence the threshold voltage of the transistor Qm1. In FIG. 1, the more negative charge injected into the floating gate of the transistor Qm1 is, the smaller absolute value of the threshold voltage of the transistor Qm1 is. Under the circumstance of keeping the control voltage Vw1, the more negative charge within the floating gate is, the higher the conduct performance associated with the transistor Qm1 is, so that the current between the source and drain of the transistor Qm1 is greater. In other words, under the circumstance of keeping the control voltage Vw1, the bit data stored in the transistor Qm1 depends on the amount of conduct current in the transistor Qm1 between its source and drain.

When reading the data stored in each memory cell, the memory 10 determines and reads the data stored in the memory cell 10 according to the amount of current provided by the transistor with a floating gate in each memory cell. Take FIG. 1 for an example again, suppose that the memory 10 is reading the bit data stored in the memory cell 12A, the control voltage Vb1 will make the access transistor Qa1 turn on, and the transistor Qm1 will provide a driven current Ip1 between its source and drain in accordance with the amount of charge stored in the floating gate; the driven current Ip1 will pass the turn-on access transistor Qa1 to the node Np3. Meanwhile, other memory cells of the memory array 14 (like the memory cell 12B) do not provide current. For instance, the control voltage Vb2 is able to turn off the access transistor Qa2 so that the memory cell 12B will not provide current for the node Np3 to affect the data-reading for the memory cell 12A.

After passing through the node Np3, the driven current Ip1 provided by the memory cell 12A will go through the transistor Q3 and then flow into the transistor Q1. The transistor Q1 as a sensing load will generate a sensing voltage Vp1 at the node Np1 after the driven current Ip1 flows into the node Np1. For this reason, the transistor Q2 as a reference load will generate a reference voltage Vp2 at the node Np2 after receiving the reference current Ip2 provided by the transistor Q5. Please refer to FIG. 2 (with reference to FIG. 1), which shows a relation diagram of the voltage versus the current associated with the two loads shown in FIG. 1. Generally speaking, the transistor Q1 as a sensing load and the transistor Q2 as a reference load are matched. The curve 20 shows the drain voltage (that is, the nodes Np1 and Np2) versus the drain current in the two transistors Q1 and Q2, both with the form of diodes. As with the previous description, when the memory cell 12A stores different bit data respectively, it can also respectively provide the different driven current Ip1. The current Ip1(A) and Ip1(B) marked in FIG. 2 represents the two different driven voltages corresponding to different bit data. When the different driven current Ip1(A) and Ip1(B) is injected from the node Np1 into the transistor Q1, the transistor Q1 can generate different sensing voltages Vp1(A) and Vp1(B) respectively depending on the relation between the current and voltage illustrated in the curve 20. Corresponding to the two possible different sensing voltages Vp1(A) and Vp1(B) of the node Np1, the fixed control voltage V0 is used to drive the gate of the transistor Q5 so that the generated reference current Ip2 is capable of generating the fixed reference voltage Vp2 of the node Np2 driven by the transistor Q2. The comparator 18 can determine the driven current Ip1 provided by the memory cell 12A, depending on whether the voltage of the node Np1 is more than the reference voltage Vp2 with Vp1(B) or less than the reference voltage Vp2 with Vp1(A), so as to determine the bit data stored in the memory cell 12A and generate the corresponding read signal Sr to achieve the purpose of reading data.

As to the transistor Q3, the inverter 16A, 16B and the transistor Q4 shown in FIG. 1 are respectively used to cut off the memory array 14 and reference unit to prevent the load effect. The purpose of the transistor Q3 connected between the node Np1 and the node Np3 is to keep the voltage on the node Np3 a constant, not interfered by a change of the sensing voltage on the node Np1. From the view of the transistor Q3 and the sensing amplifier module, each memory cell in the memory array 14 is equivalent to a large equivalent capacitor C0 (marked in FIG. 1). If the voltage on the node Np3 changes as the voltage on the node Np1 changes, it is equal to charging or discharging the equivalent capacitor C0. The driven voltage provided by memory cells have to distribute a part of current to charge or discharge the equivalent capacitor C0 so as to change the voltage on the node Np3. In this way, such not only affects reading data, but also extends a read time until the equivalent capacitor C0 finishes being charged or discharged. Therefore, the function of the transistor Q3 is to keep the voltage on the node Np3 to prevent the negative effect caused by the large load of the equivalent capacitor C0. The operational principle of the transistor Q3 can be stated briefly as follows. When the voltage on the node Np3 rises up, the inverter 16A will relatively reduce the gate bias voltage of the transistor Q3 to increase turn-on efficiency of the p-type MOS transistor Q3, so as to reduce the voltage on the node Np3. On the contrary, if the voltage on the node Np3 falls down, the inverter 16A will increase the gate bias voltage of the transistor Q3, relatively decreasing the turn-on efficiency of the p-type MOS transistor Q3, so as to increase the voltage on the node Np3. The voltage on the node Np3 can be kept approximately constant due to the feedback control via the inverter 16A.

The defects of the conventional memory 10 are described briefly as follows. First, because the transistors Q1 and Q2 are connected with the type of diode to form a sensing load and a reference load respectively, and their current-voltage curve, shown in FIG. 2, is the parabolic curve 20 which the concave of the parabolic curve 20 indicates as upward (as the direction indicated by an arrow A1 in FIG. 2). That means even if the current difference between the two different driven currents Ip1(A) and Ip1(B) provided by memory cells is large, the corresponding voltage difference between the two sensing voltages Vp1(A) and Vp1(B) will not be large, involving that the difference between the two sensing voltages and reference voltage Vp2 (the voltage difference dV1 and dV2 marked in FIG. 2) will not be enlarged. The data-reading process of the memory 10 depends on whether the comparator 18 can distinguish the voltage between the sensing voltage Vp1 and the reference voltage Vp2 clearly. The noise margin during reading process will be reduced, easily resulting in error-readings due to noise when the voltage differences dV1 and dV2 are not large. For instance, if the voltage difference dV is too small, a small noise invading the node Np1 leads to the sensing voltage Vp1(A), originally smaller than the reference voltage Vp2, being larger than the reference voltage Vp2, and results in the comparator 18 reading the data within the memory 12A incorrectly on account of the invasion of noise.

In addition, in the conventional flash memory 10, the gates of the transistors Q1 and Q2 as load units are driven by the voltages on the nodes Np1 and Np2 respectively, and the driven state of the two transistors are separated so that the two transistors will be respectively affected by different noises, leading to the differential-driven comparator 18 easily affected by dual noises. For example, suppose that the memory cell 12A provides the driven current Ip1 (A), but the node Np1 is invaded by a positive-voltage noise, making the sensing voltage Vp1 on the node Np1 larger than the driven voltage Vp1(A) marked in the FIG. 2. Meanwhile, the node Np2 is invaded by a negative-voltage noise, making the reference voltage on the node Np2 smaller than the reference voltage Vp2 marked in the FIG. 2. Consequently, the reference voltage Vp2 is more likely to become smaller than the driven voltage Vp1, resulting in the comparator 18 incorrectly recognizing that the data of the memory cell 12A corresponds to the driven current Ip1 (B).

As with the previous statement, flash memories have been extensively utilized in kinds of microprocessor systems in need of different DC bias voltages Vd. Some of computer systems probably can provide a 6V (volt) DC bias; other portable devices may merely provide lower-than-2V DC bias. However, one of the purposes which the information industry tries to achieve is to make the same memory designation being able to work under different bias voltages. One of the defects of the conventional memory 10 is difficulty in adapting for use in different operational environments. Please keep referring to FIG. 3. Basically, the FIG. 3 shows the identical memory 10 shown in FIG. 1, but further shows the typical comparator 18 and the inverter 16A. The inverter 16A in the FIG. 3 is formed by a CMOS transistor consisting of an n-type MOS transistor Q11 and a p-type MOS transistor Q12. The comparator 18 has a differential input composed by n-type MOS transistors Q7 and Q8. The current source 22 is used to bias the differential input, p-type MOS transistors Q9 and Q10 act as active loads for taking out the read signal Sr from the node Np6. The inverter 16A and the comparator 18 both are biased by the DC bias voltage Vd and low DC bias voltage Vg.

As with the previous description, voltage on the node Np3 is kept at a constant by the transistor Q3, however, on account of the fixed voltage depending on the bias voltage of the memory array 14, no matter what the bias voltage Vd is, the voltage on the node Np3 usually can be kept to a fixed voltage. For the transistor Q12 in the inverter 16A, its bias voltage of the gate is fixed, but its source bias voltage Vd will change with different operation environments. As a result, under different operation environments, the inverter 16A, owing to various bias conditions among the ends of the transistor Q12, will be hardly biased within a better bias voltage range, and so will the inverter 16B. For this reason, the sensing voltage Vp1 on the node Np1 and the reference voltage Vp2 on the node Np2 will also approximately be kept in a fixed range under various operation environments (even though the sensing voltage Vp1 will change, the changing range relative to the difference between different bias voltages in kinds of operation environment is still much smaller). As a result, the bias voltage of the transistors Q7 and Q8 in the comparator 18 will also be kept roughly. Comparatively, each bias condition of each end of the transistors Q9 and Q10 that is mainly controlled by the bias voltage Vd, has great change under different operation environments, so that the comparator 18 is hardly kept a better bias voltage in the different operation environments. The above-mentioned factors are all reasons of why it is hard to design the conventional memory 10 to adapt to various conditions. The specific circuit must be redesigned for the conventional memory to work regularly on account of the specific operation condition. Consequently, it is a disadvantage of development and popularity for flash memories because of spending more time for circuit-designing and manufacturing time, and resources.

SUMMARY OF INVENTION

Therefore, a primary objective of the claimed invention is to provide a flash memory with sensing amplifiers using load transistors driven by coupled gate voltages to overcome the problems with the prior art.

The sensing amplifying modules of conventional memory, in which transistors whose gate and drain are short to form a diode act as loads, respectively generates sensing voltage and reference voltage, according to the current provided by the memory cell and the reference unit, and compares with sensing voltage and reference voltage through the comparator to read data. The current-voltage relation of the load formed in the type of diode by a transistor is not so good so that the voltage difference between sensing voltage and reference voltage is not apt to expand, resulting in a noise margin reduction. Two loads unit, respectively connected to the memory array and the reference unit are separated with each other, easily lead to dual noise effect. The capability in control of bias voltages on each node in conventional memories is worse so that it is difficult for the identical conventional memories to fit different operation conditions with different bias voltages.

However, the memory of the claimed invention, taking two transistors whose gates are coupled with each other as a load, respectively generates sensing voltages and reference voltages according to the current provided by memory cells and reference unit, and compares with sensing voltages and reference voltages through a comparator. In order to keep a voltage of a load unit, the claimed memory feeds back the voltage on the gates of the two loads through a bias voltage generated by a load by way of a control circuit. The loads with coupled gates can generate a voltage, according to the current-voltage curve of common source amplifier, to make a larger voltage difference between the sensing voltage and the reference voltage so as to increase an operation margin and a noise margin. The loads with coupled gates can transform a noise into a common mode noise, and remove it as driving the differential input comparator. The control circuit can not only actively control the bias voltages on each node in the memories, but also fit the memory of the claimed invention to different operation conditions.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

FIG. 5A and FIG. 5B are current-voltage curves of related loads illustrated in FIG. 4.

DETAILED DESCRIPTION

Figure 1:
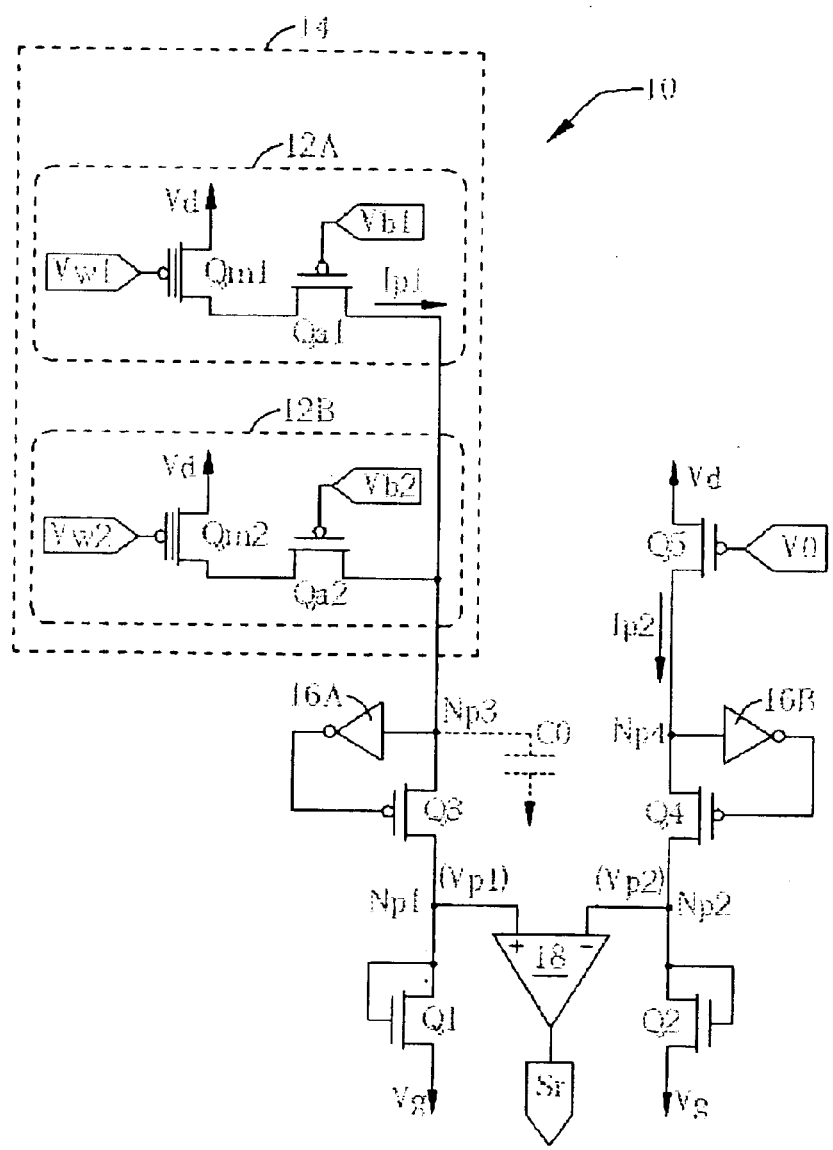
FIG. 1 is a circuit diagram of a flash memory according to prior art.
Figure 4:
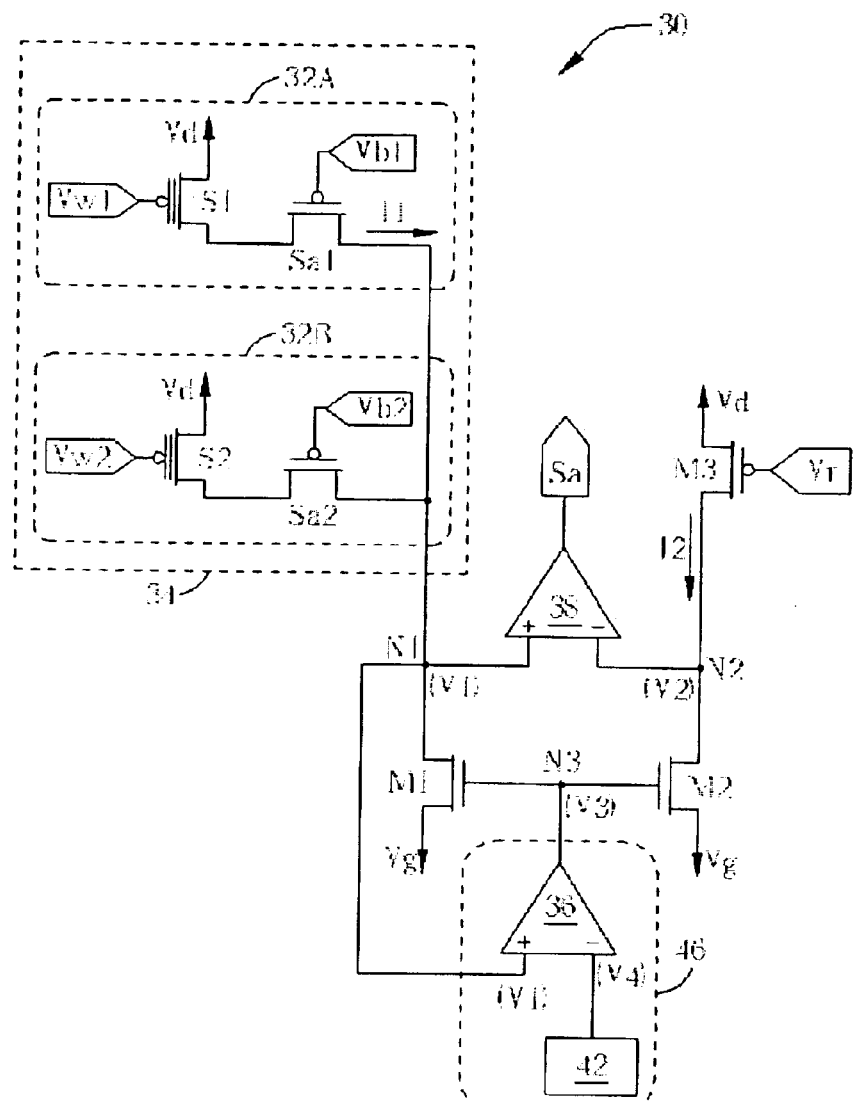
FIG. 4 is a circuit diagram of a first embodiment of the memory according to the present invention.

Please refer to FIG. 4. FIG. 4 is a circuit diagram of a memory 30 of a first embodiment according to the present invention. The memory 30 comprises a memory array 34 having a plurality of memory cells shown as memory cells 32A and 32B respectively, each for storing a bit data. According to the present invention, the circuit configuration of the memory array 34 and each memory cell can be the same memory array and memory cells as the prior art or other memory cells. In FIG. 4 the same memory array and memory cells as that the memory 10 are used as the illustrating embodiment. Take the memory cell 32A for an example, it has a MOS S1 with a floating gate, and an access transistor Sa1. Control voltages Vw1 and Vb1 are used to control the gate of transistor S1 and Sa1 respectively. Acting as a flash memory, the principle of storing bit data in each memory cell within a memory 40 is similar as that of the memory 10 shown in FIG. 1. Take the memory cell 32A for an example, storing various bit data depending on a various amount of charge infused into the floating gate, the transistor S1 provides various driven current, under a fixed control voltage Vw1 applied on the gate. Corresponding to each memory cell in the memory array 34, the memory 30 has a P-type MOS M3 whose gate is controlled by a constant control voltage Vr to provide a fixed reference current. The transistor M3 also can be a transistor with a floating gate, which stores a constant charge in the floating gate. The memory 30 is also biased by a DC bias voltage Vd, and a lower-than-Vd bias voltage Vg as a ground voltage, i.e. zero voltage level.

One of the primary advantages of the memory according to the present invention is that a new sensing amplifier module is set in the present invention. As shown in FIG. 4, in addition to the memory array 34, the memory 30 further has N-type MOS transistors M1 and M2, a comparator 38 and a control circuit 46 forming a sensing amplifier module for reading the bit data stored in each memory cell of the memory array 34. The transistor M1 is a sensing load, of which the drain at the node N1 is electrically connected to the memory array 34, and the gate at the node N3 is electrically connected to the control circuit 46. While reading data stored in a memory cell, the driven current provided by this memory cell is injected into the transistor M1 through the node N1, and the transistor M1 generates a sensing voltage V1 at the node N1. For the transistors with a floating gate within each memory cell of the memory array 34, the gate of the transistor M3 is controlled by the DC control voltage Vr in order to turn on the transistor M3 by a fixed reference current I2 and thus to inject it to the node N2. The transistor M2, of which the drain is electrically connected to the node N2 and the gate is electrically connected to the node N3, functions as a reference load. After receiving the reference current I2, the transistor M2 generates a reference voltage V2 at the node N2. The comparator 38 is used for comparing the sensing voltage V1 with the reference voltage V2, and generates a signal Sa according to the comparison. The control circuit 46 comprises another comparator 36 and a voltage generator 42 for generating a constant predetermined voltage V4. In the preferred embodiment, the voltage generator 42 is a voltage follower capable of generating a constant predetermined voltage V4 lower than the bias voltage Vd. For example, the predetermined voltage V4 can be a constant voltage lower than the bias voltage Vd by two-times the threshold voltage. The comparator 36 has two input ends (marked as "+" and "−" in FIG. 4) electrically connected to the node N1 and the voltage generator 42 respectively. The output end of the comparator 36 is electrically connected to the node N3 to generate a driven voltage V3 for controlling the gate bias voltages of the transistors M1 and M2 synchronously. In the present invention, the comparator 36 can be realized by a differential amplifier. According to the voltage difference between the sensing voltage V1 and the predetermined voltage V4, the driven voltage V3 can feedback to drive the transistors M1 and M2, which results in the sensing voltage V1 on the node N1 in accordance with the predetermined voltage V4 generated by the voltage generator 42. In other words, the control circuit 46 keeps the sensing voltage V1 a substantially constant equivalent to the predetermined voltage V4 on the node N1 in the way of driving the transistor M1.

The following describes in detail the principle of how the memory 30 performs data reading. For instance, while the memory 30 reads a bit data within the memory cell 32A, the driven current I1 provided by the transistor S1, based on the bit data, is conducted to the node N1 of the transistor M1 through the turn-on transistor Sa1. Please refer to FIG. 5A and FIG. 5B. FIG. 5A is an I-V curve schematic diagram of the transistor M1 and FIG. 5B is that of the transistor M2. The horizontal axis represents the voltage (that is, the voltage between drain and source of each transistor), while the vertical-axis represents the current, (that is, the currents between drain and source of each transistor). Since both of the sources of the transistors M1 and M2 are connected to the lower bias voltage Vg, therefore, the horizontal-axis illustrated in FIG. SA and FIG. 5B can represent the voltages of the nodes N1 and N2 while the vertical-axis represent the currents injected into the nodes N1 and N2 respectively. As previously mentioned, the bit data stored in the memory cell 32A is probably bit "0" or bit "1" versus the different driven current I1(A) or I1(B) of the driven current I1 provided by the memory cell 32A. As marked in FIG. 5A, since the comparator 36 of the control circuit 46 keeps the predetermined voltage V4 on the node N1, if the driven current I1 (A) is injected into the transistor M1, then the comparator 36 will drive the gate of the transistor M1 with a driving voltage V3(A) on the node N3, the I-V curve 40A shown in FIG. 5A is in satisfaction with the bias condition of the current I1(A) versus the predetermined voltage V4 on the node N1. Relatively, if the stronger driving current I1(B) is provided by the memory cell 32A, in order to keep the node N1 the predetermined voltage V4, the comparator 36 will raise the driving voltage on the node N3 to V3(B), which fits the I-V curve 40B of the transistor M1.

When the comparator 36 drives the gate of the transistor M1 with the driving voltage V3(A) or V3(B) corresponding to the driving current I1(A) or I1(B), it also drives a reference load, the transistor M2, with the same driving voltage via the node N3 simultaneously. As shown in FIG. 5B, when the gate of the transistor M2 is driven by the driving voltage V3(A) or V3(B), the corresponding I-V curve of the transistor M2 is curve 41A or 41B respectively.

Since a fixed reference current I2 from the reference transistor M3 flows into the transistor M2 by way of the node N2, the reference voltage V2 on the node N2 will change to the reference voltage V2(A) or V2 (B) versus the driving current I1(A) or I1(B) based on the curve 41A or 41B. After ascertaining that the reference voltage V2 on the node N2 is the reference voltage V2(A) which is higher than the sensing voltage V1 or the reference voltage V2(B) which is lower than the sensing voltage V1, the comparator 38 can determine whether the driving current provided by the memory cell 32A is I1 (A) or I1(B), so as to recognize the bit data stored in the memory cell 32A. To sum up, in the memory 30, even the driving current injected to the transistor M1 may be the driving current I1(A) or I1(B), the sensing voltage V1 on the node N1 still keeps the constant predetermined voltage V4, due to the control circuit 46 driving the transistor M1. On the other hand, under the control circuit's 46 driving, the transistor M2 respectively generates different reference voltages V2 (A) and V2 (B) depending on the driving currents I1 (A) and I1 (B) on the node N2, and so recognizes the bit data within the memory cells.

Figure 6:
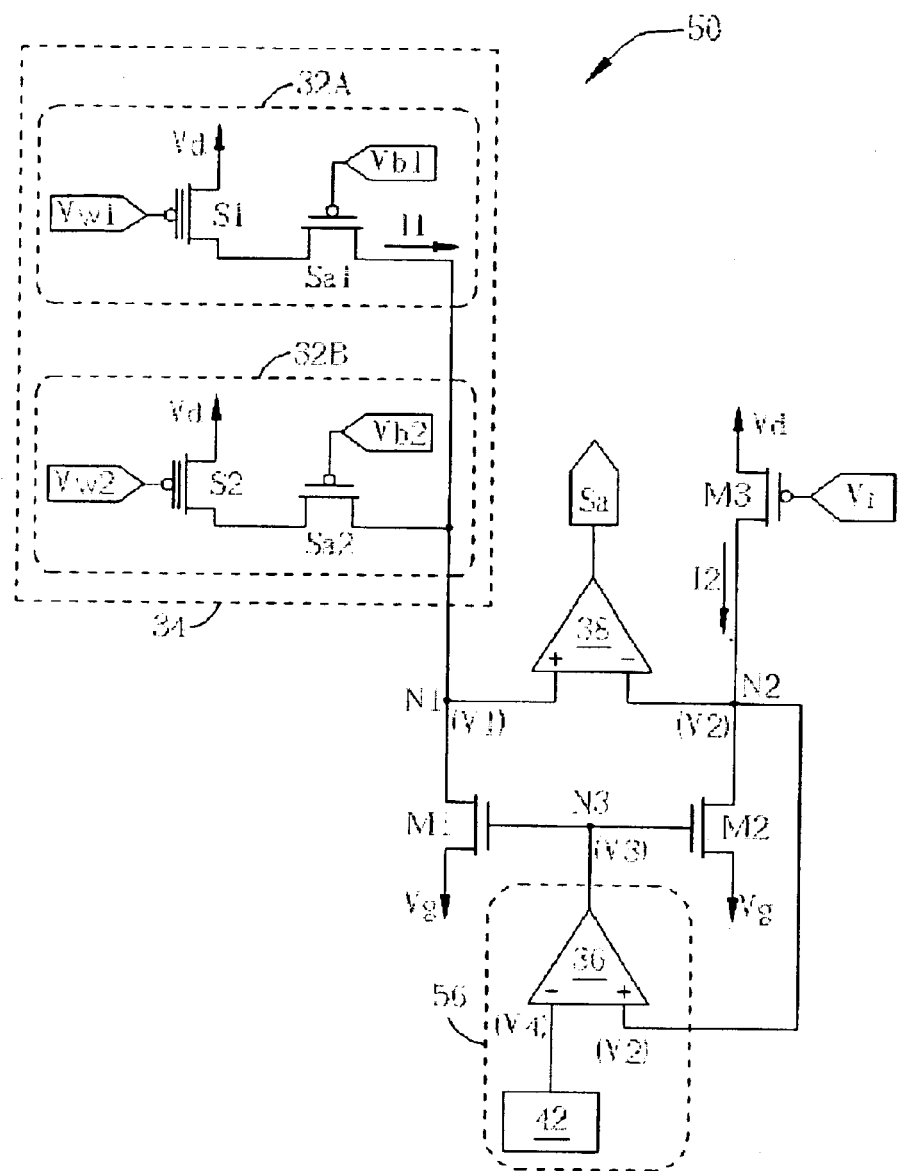
FIG. 6 is a circuit diagram of a second embodiment of the memory according to the present invention.

Please refer to FIG. 6, a circuit schematic diagram of another embodiment memory 50 according to the present invention. For simplicity, the identical labeled components of the memory 50, and of the memory 30 have the same function. Such as the memory cells in the memory array 34, which provides the driving current according to stored bit data, the transistor M3 for generating the constant reference current I2, the transistor M1 as the sensing load in the sensing amplifier module for generating the reference voltage V1, the transistor M2 as the reference sensing load for generating the reference voltage V2, and the comparator 38 for reading data and generating read signal Sa according to the sensing voltage V1 and the reference voltage V2. The memory 50 also has a control circuit 56 for controlling the driving voltage V3 on the control node N3. The control circuit 56 has a voltage generator 42 generating a constant predetermined voltage V4 and another comparator 36. Differing from the memory 30 shown in FIG. 4, the input ends, labeled as "+" and "−", of the comparator 36 of the memory 50 respectively are electrically connected to the voltage generator 42 and the node N2. That means the comparator 36 drives the transistor M2 with the driving voltage V3 on the node N3, so as to keep the reference voltage V2 on the node N2 a constant, i.e. the predetermined voltage V4.

Figure 7:
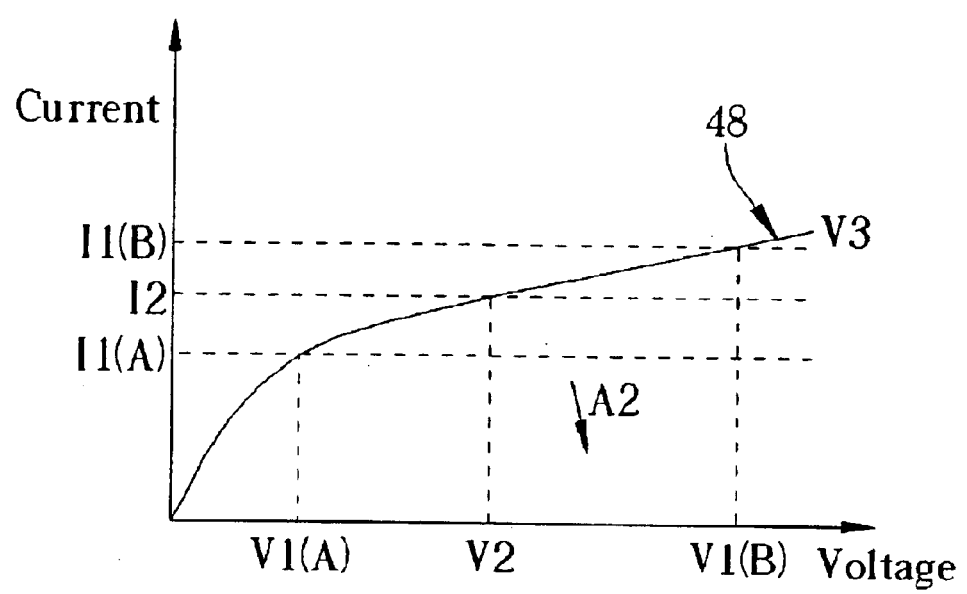
FIG. 7 is a current-voltage curve of related loads illustrated in FIG. 6.

As to the principle of reading bit data with respect to memory cells of the memory 50 in FIG. 6, please refer to FIG. 6 and FIG. 7. The curve 48 shown in FIG. 7 is an I-V curve associated with the drain-source of the transistor M1, where horizontal-axis represents the voltage and the vertical-axis represents the current. Similarly, the source of the transistor M1 of the memory 50 is electrically connected the low constant bias voltage Vg, so the voltage represented on the X-axis also can be regarded as the sensing voltage V1 on the node N1. The reference current I2, from the reference unit M3 to the node N2, is a constant current, hence the comparator 36 keeps the reference voltage V2 on the node N2 a constant only by keeping the driving voltage V3 on the node N3 a constant. Suppose the memory 50 wants to read the data within the memory cell 32 A, then the memory cell 32A provides different driving current I1 (A) or I1 (B) depending on the stored bit data to the node N1. The control circuit 56 keeps the driving voltage V3 on the node N3 a constant, as a result, the I-V curve with respect to the transistor M1 remains as the curve 48 in FIG. 7. The corresponding memory cell provides the driving current I1 (A) or I1 (B) to the transistor M1; then the transistor M1 generates the sensing voltage V1 (A) or V1 (B) on the node N1 according to the curve 48. The I-V curve with respect to the transistor M2, on account of the transistor M2 being matched with the transistor M1, is similar with the curve 48 so that the reference current 12, between the driving current I1 (A) and I1 (B), generates the reference voltage V2, between the sensing voltage V1 (A) and V1 (B), on the node N2. After ascertaining whether the sensing voltage on the node N1 is the reference voltage V1 (A) which is higher than the reference voltage V2 or the sensing voltage V1 (B) which is lower than the reference voltage V2, the comparator 38 equivalently recognizes the driving current provided by the memory cell, and thus reads the bit data stored in the memory cell. Please notice that, according to the present invention, the transistor M1 and M2 are mismatched, as long as the reference voltage V2 between the sensing voltages V1 (A) and V1 (B) can be biased by the reference current 12 through the transistor M2. The transistor M2 is able to read the bit data stored in the memory cells by the same principle of data reading, even the reference current 12 does not have to be between the driving current I1 (A) and I1 (B).

Figure 2:
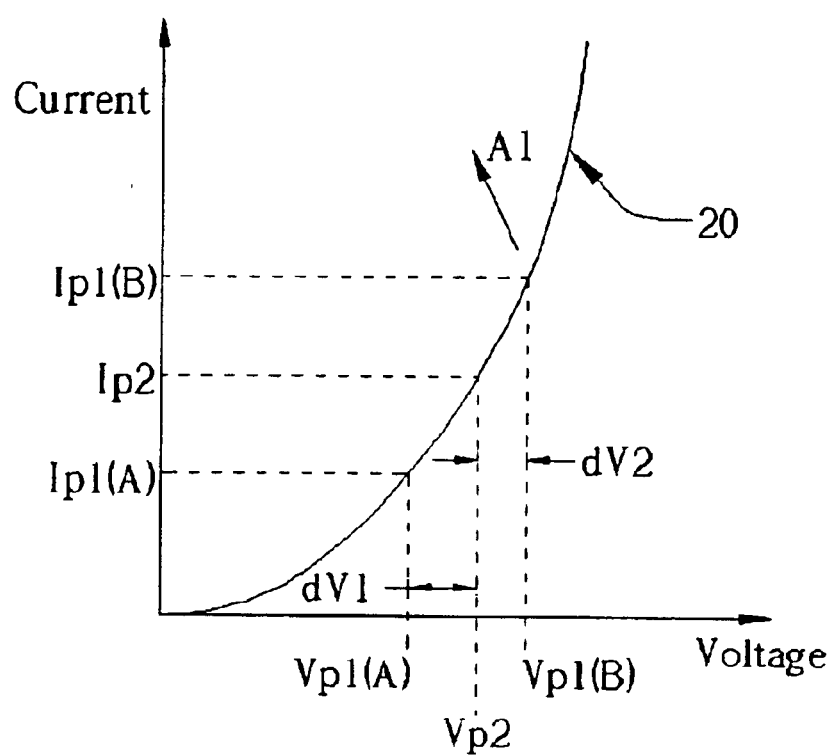
FIG. 2 is a diagram of current-voltage relation of the load unit shown FIG. 1.

It is advantage of the present invention that, first, according to FIG. 5 and FIG. 7, the transistors as the loads, inclusive of the sensing load or the reference load, are performed by independent bias voltages respectively applied on the gate and the drain. That is similar to the common source amplifier. So the difference between the sensing voltage and the reference voltage can be incremented, since two transistors have current-voltage curves that are downward concave (as the direction of arrow A2 shown in FIG. 7), which makes the sensing amplifier module of the memory have more noise margin and operation margin. On the other hand, in the conventional memory 10, the transistors functioning as a diode acts as loads, so the difference between the sensing voltage and the reference voltage that are generated according to the upward-concave I-V curve shown in FIG. 2 is hardly incremented so as to fail to promote the operation margin and the noise margin during reading data.

Second, because the gates of the two loads, the transistor M1 and M2, are driven and controlled by the control circuit commonly in the present invention, even if noise intrudes the gates of the two loads, it will turn a common mode noise at the drain of the transistors, i.e. the node N1 and N2. Through the comparator 38, the common mode noise is filtered off so as not to affect the data reading in the present invention. For instance, if there is a positive noise arising the driving voltage V3 on the node N3, since the driving voltage V3 drives the transistors M1 and M2 simultaneously, the voltages on the nodes N1 and N2 decreases simultaneously so as to keep the difference between the sensing voltage V1 and the reference voltage V2. Hence, the comparator 38 can compare the two voltages to read the data correctly. On the other hand, intrusion of noise leads to the dual effects for the two transistors as loads of the conventional memory 10, whose three ends separate with each other.

Furthermore, the sensing amplifier module of the memory according to present invention has better bias control over each node, therefore, the design of the memory widely used in various bias operation environments. Please refer to FIG. 4, take the memory 30 for an example, the control circuit 46 is capable of keeping the voltage on the node N1 as high as the predetermined voltage V4, involving that the voltage on the node N2 is fixed within a range between the reference voltage V2 (A) and V2 (B). The present invention can keep the voltage on the node N1 at a given substantial constant so as to not only separate from the load effect of the memory array 34, but also to the comparators 36 and 38 of the memory 30 be capable of biasing in a proper range according to the bias voltage Vd. As mentioned before, for the light of the sensing amplifier module, the memory array 34 being electrically connected to the node N1 is equivalently a great capacitor. The memory 30 keeps the voltage on the node N1 at a substantial constant by the control circuit's driving. Since the driving current provided by the memory cell does not have to charge and discharge to the great equivalent capacitor, as a result, the load of the equivalent capacitor will not affect the reading process. Moreover, there is a better bias control over the whole memory array 34. Through properly adjusting the predetermined voltage V4 generated by the voltage generator 42, even under various DC bias Vd operating environment, the biases of the nodes N1 and N2 are capable of being actively controlled.

Figure 3:
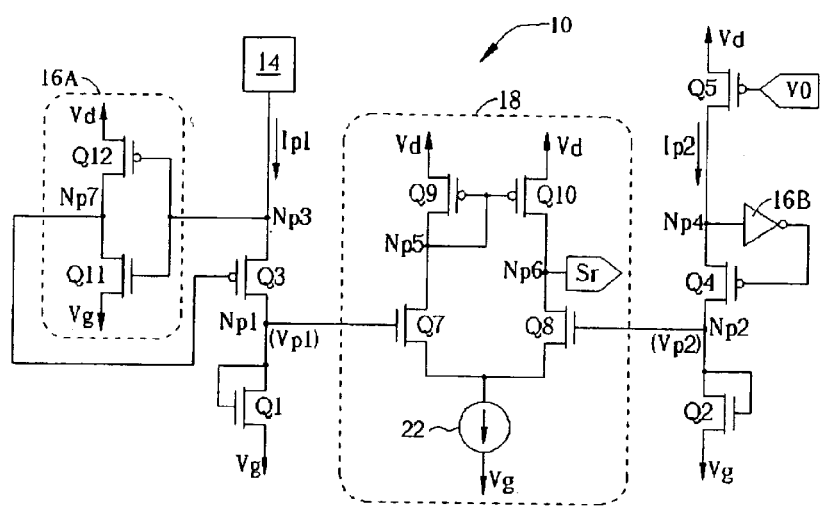
FIG. 3 is a more detailed circuit diagram of the memory illustrated in FIG. 1.
Figure 8:
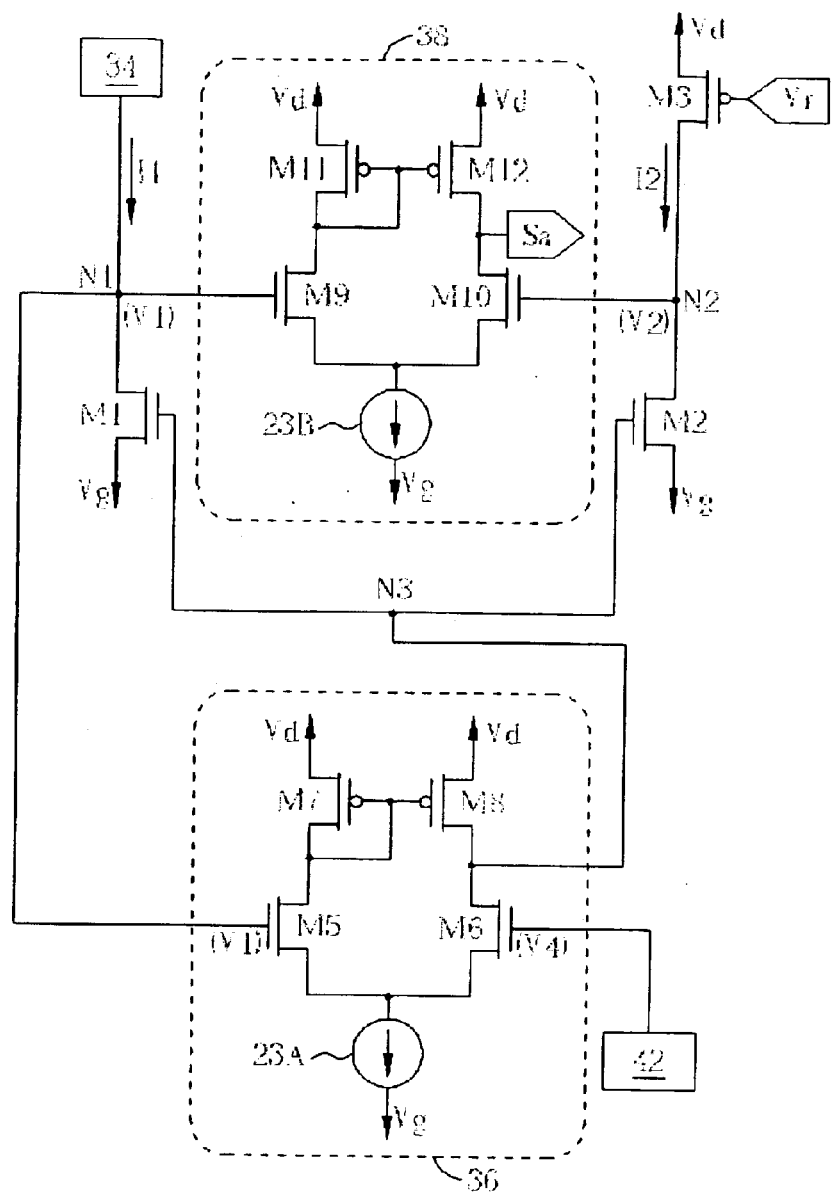
FIG. 8 is a more detailed circuit diagram, of the memory shown in FIG. 4.

The control circuit strengthens the bias control of the comparators 36 and 38 in the sensing amplifier module. Please refer to FIG. 8, FIG. 8 is a more detailed circuit diagram of the memory 30 shown in FIG. 4 The comparators 36 and 38 with the DC bias voltage Vd, form differential input pairs with the N-type MOS transistors M5, M6, M9 and M10, respectively, and form active loads with P-type MOS transistors M7, M8, M11, and M12, respectively. The current sources 23A and 23B are used for biasing the differential input pairs. Because the voltage range on the nodes N1 and N2 is controlled by the predetermined voltage V4 generated by the voltage generator 42, while simultaneously adjusting the predetermined voltage V4 in accordance with the bias voltage Vd, the bias of the N-type MOS transistors within the comparators 36 and 38 can be adjusted in accordance with the bias voltage Vd so as to match the P-type MOS transistors of the comparator 36 and 38, which are applied with the bias voltage Vd to prevent against a huge change of the bias voltage range on each end of each transistor when the bias voltage Vd changes. As mentioned above, according to the preferred embodiment, the voltage generator 42 is a voltage follower, capable of generating a voltage (Vd-Vc) as the predetermined voltage V4. That is, generating the predetermined voltage V4 lower than the bias voltage Vd by a constant voltage Vc. In this way, when the memory according to the present invention is under various bias operation environments, even if the bias Vd changes, the control circuit will simultaneously change the bias voltages on the nodes N1 and N2 based on the predetermined voltage which changes synchronously with the bias voltage. That makes the bias of each end of the N-type and P-type transistors of the comparators 36 and 38 change simultaneously, so as to keep the voltage difference between each end within a preferred range and without huge change. On the other hand, for the memory 10 shown in FIG. 3, the bias of each N-type transistor, no matter if it is the transistors of the inverter 16A, 16B or those of the comparator 18, cannot be freely set with the bias Vd. Because each bias of P-type transistor is determined by the bias Vd, when the memory 10 is used in various bias operation environments, the bias of each N-type transistors cannot change as the bias of the p-type transistors, resulting in hardly working normally due to the great change of voltage difference among each of the ends of each transistor. Consequently, the design of the memory 10 according to the prior art is incapable of being used for various bias operation environments.

Figure 9:
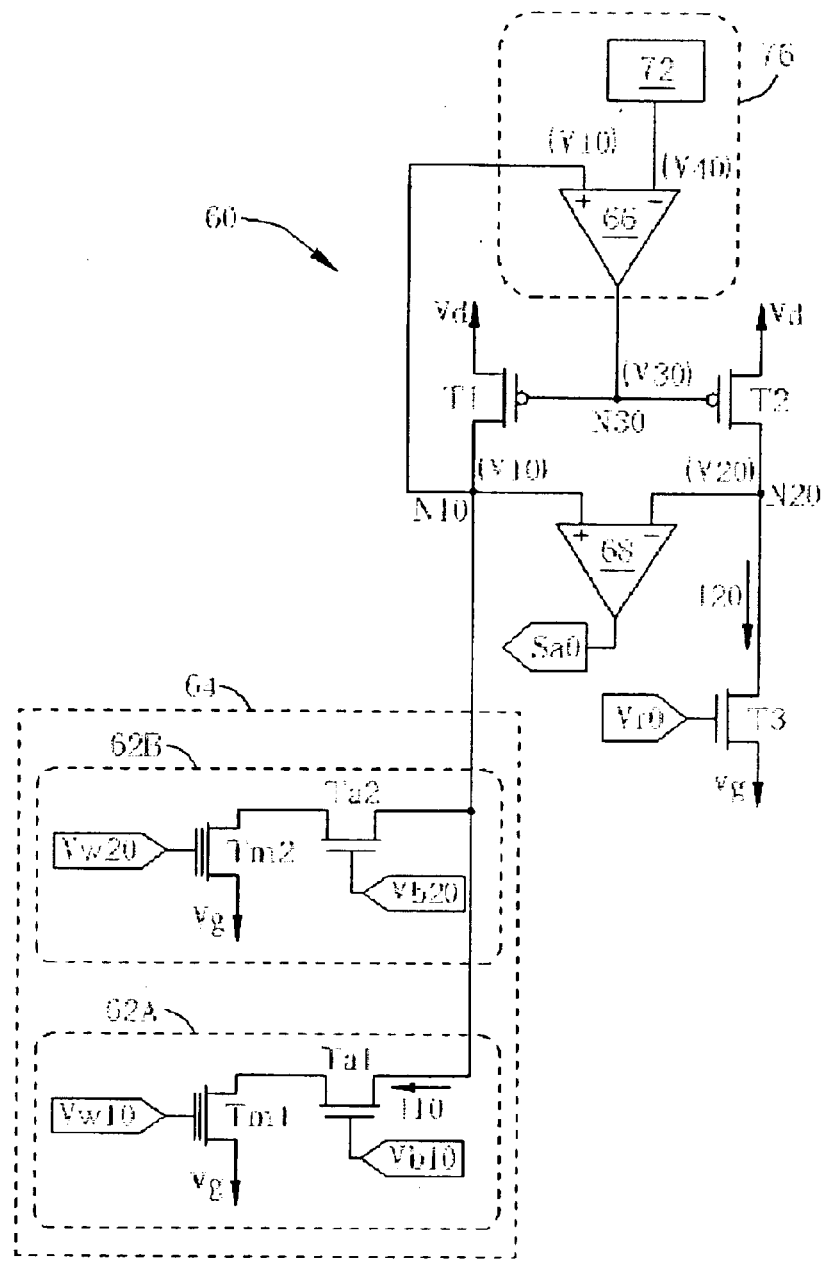
FIG. 9 is a circuit diagram of a third embodiment of the memory according to the present invention.

Please refer to FIG. 9, a circuit diagram of another embodiment of a memory 60 according to the present invention. The memory 60 performs data reading process by the same principle of the memory 30 shown in FIG. 4. The memory 60, however, is designed for the memory cell of the N-type transistor while the memory 30 is designed for the P-type transistor. The memory 60 in FIG. 9 has a memory array 64 comprising a plurality of memory cells (two memory cells 62A and 62B in FIG. 9 as represent). Each memory cell is for storing a bit data. Take the memory cell 62A for an example, a N-type MOS transistor Tm1 with a floating gate is used for storing data and acts as a current sink providing a driving current 110 based on the different stored data. A transistor Ta1 functions as an access transistor. Corresponding to the memory array 64, the transistor T3 as a reference unit is an N-type MOS transistor, or a transistor with a floating gate, for driving a constant reference current 120. Transistors T1 and T2 of the memory 60, a comparator 68 and a control circuit 76 form a sensing amplifier module, where the transistor T1, T2 respectively act as a sensing load for generating a sensing voltage V10 on a node N10, and as a reference load for generating a reference voltage V20 on a node N20. A voltage generator 72 of the control circuit 76 is used to generate a constant predetermined voltage V40. The comparator 66 controls the gates of the transistors T1 and T2 with a driving voltage V30 through a node N30 and keeps the sensing voltage V10 on the node N10 at the predetermined voltage V40. After comparing between the sensing voltages V10, V20 on the nodes N10, N20, the comparator 68 can read out the data within the memory cell and generate a corresponding signal Sa0. The operating principle of the memory 60 is similar to that of the memory 30, and so can be understood from FIG. 4, FIG. 5A, FIG. 5B and the corresponding explanation. The advantages as to the memory 60 are also the same as the above-mentioned memory.

Figure 10:
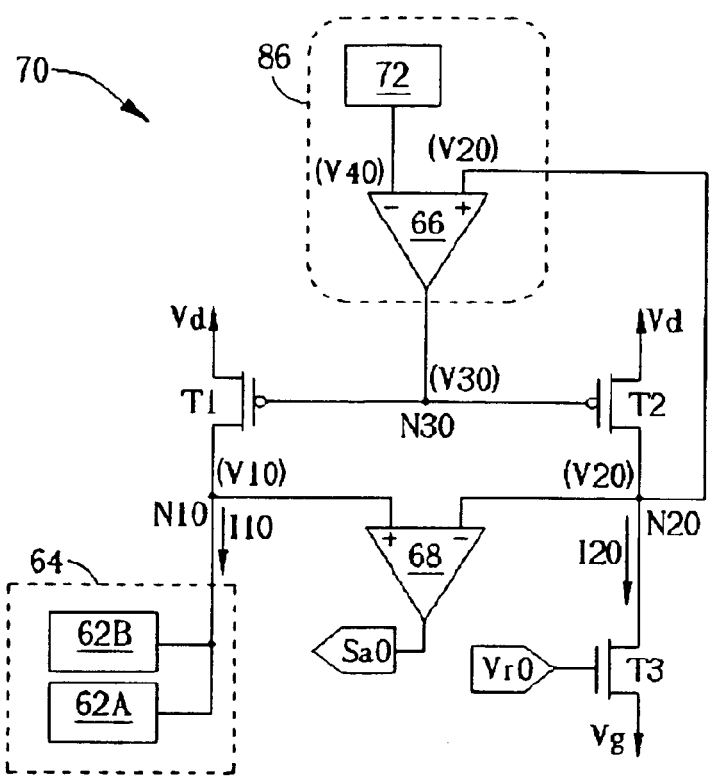
FIG. 10 is a circuit diagram of a fourth embodiment of the memory according to the present invention.

Please refer to FIG. 10. FIG. 10 is a circuit diagram of another embodiment of a memory 70 according to the present invention. The memory, similar to the memory 60, is designed for the memory cells composed by the N-type transistors. For simplicity, in FIG. 10, the identical labeled components of the memory 60 and of the memory 70 have the same function. Differing from the memory 60, the memory 70 keeps the reference voltage V20 at the constant predetermined voltage V40 by means of a driving voltage V30 on the node N30, generated by the comparator 66 of the control circuit 86, according to the reference voltage V20 on the node N20. The operating principle of the memory 70 is similar to that of the memory 50 in FIG. 6, and so can be understood by FIG. 7 and the above-mentioned explanation.

The conventional sensing amplifier module of the memory, where the transistor functions as a diode is used as the sensing load and reference load for being generated the sensing voltage and reference voltage respectively, reads data within the memory cell based on the sensing voltage and reference voltage. In virtue of the characteristic of the I-V curve of the load, a diode formed by a transistor, the separation of the two loads, and no active control of the bias on the related nodes in the sensing amplifier module of the memory according to the prior art, the noise margin and operation margin of the memory are limited and easily affected by noise. The design of the memory cannot be used in various bias operation environments. On the contrary, according to the present invention, a single control circuit commonly controls both the gates of the sensing load and the reference load, which keeps the sensing voltage or the reference voltage at a constant predetermined voltage capable of being set freely. Such I-V curve of the similar common source mode amplifier module can increase the difference between the reference voltage and sensing voltage. The noise intrusion of the two loads driven by the coupled gate voltage is in common mode, and thus is reduced by the differential-driven comparator. The control circuit also strengthens the bias control in the sensing amplifier module so that the transistors and inverters for separating loads are not needed. The design of the memory based on the present invention is capable of performing under various bias operation environments, which reduces the cost of design and manufacturing.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A memory comprising:
    at least a memory cell for storing data and providing a driving current according to the data so that the driving current provided by the memory cell is changed by a change in the stored data in the memory;
    a sensing load for receiving the driving current provided by the memory cell and a node voltage, and for outputting a sensing voltage based on the driving current and the node voltage;
    a reference load for receiving the node voltage and for outputting a reference voltage based on the node voltage;
    a control circuit for adjusting the node voltage; wherein when the driving current changes, the sensing voltage remains substantially unchanged; and
    a comparator for determining the data stored in the memory cell based on a difference between the sensing voltage and the reference voltage.

2. The memory of claim 1 wherein when the driving current increases, the control circuit increases the node voltage to keep the sensing voltage substantially constant.

3. The memory of claim 1 wherein the control circuit further comprises:
    a voltage generator for generating a predetermined voltage; and
    a second comparator for adjusting the node voltage based on a voltage difference between the sensing voltage and the predetermined voltage so that the sensing voltage is substantially equivalent to the predetermined voltage.

4. The memory of claim 3 wherein the voltage generator is a voltage follower.

5. The memory of claim 1 wherein the sensing load comprises a metal-oxide-semiconductor (MOS) transistor, a gate of the transistor is electrically connected to the control circuit for receiving the node voltage and a drain of the transistor is electrically connected to the memory cell for receiving the driving current provided from each memory cell.

6. The memory of claim 5 wherein the drain of the transistor, for outputting the sensing voltage, is also electrically connected to the control circuit and the comparator.

7. The memory of claim 1 wherein the reference load comprises a metal-oxide-semiconductor (MOS) transistor, a gate of the transistor for receiving the node voltage is electrically connected to the control circuit and a drain of the transistor for outputting the reference voltage is electrically connected to the comparator.

8. The memory of claim 7 further comprises a reference unit for generating a reference current; wherein the drain of the transistor of the reference load is also connected to the reference unit so that the transistor is biased by the reference current.

9. The memory of claim 1 wherein each memory cell comprises a metal-oxide-semiconductor (MOS) transistor with a floating gate.

10. A memory comprising:

at least a memory cell for storing data and for providing a driving current according to the data so that the driving current provided by the memory cell is changed by a change in the stored data in the memory;

a sensing load for receiving the driving current provided by the memory cell and a node voltage, and for outputting a sensing voltage based on the driving current and the node voltage;

a reference load for receiving the node voltage and for outputting a reference voltage based on the node voltage;

a control circuit for adjusting the node voltage to keep the reference voltage substantially constant; and a comparator for determining the data stored in the memory cell based on a difference between the sensing voltage and the reference voltage.

11. The memory of claim 10 wherein the control circuit further comprises:

a voltage generator for generating a predetermined voltage; and a second comparator for adjusting the node voltage based on a voltage difference between the reference voltage and the predetermined voltage so that the reference voltage is substantially equivalent to the predetermined voltage.

12. The memory of claim 11 wherein the voltage generator is a voltage follower.

13. The memory of claim 10 wherein the sensing load comprises a metal-oxide-semiconductor (MOS) transistor, a gate of the transistor is electrically connected to the control circuit for receiving the node voltage and a drain of the transistor is electrically connected to the memory cell for receiving the driving current provided from each memory cell.

14. The memory of claim 10 wherein the reference load comprises a metal-oxide-semiconductor (MOS) transistor, a gate of the transistor for receiving the node voltage is electrically connected to the control circuit and a drain of the transistor for outputting the reference voltage is electrically connected to the comparator.

15. The memory of claim 14 wherein the drain of the transistor for outputting the reference voltage to the control circuit is also electrically connected to the control circuit.

16. The memory of claim 15 further comprises a reference unit for generating a reference current; wherein the drain of the transistor of the reference load is also connected to the reference unit so that the transistor is biased by the reference current.

17. The memory of claim 1 wherein each memory cell comprises a metal-oxide-semiconductor (MOS) transistor with a floating gate.

* * * * *